United States Patent
Lee et al.

(10) Patent No.: US 8,841,663 B2
(45) Date of Patent: Sep. 23, 2014

(54) OXIDE SEMICONDUCTOR THIN-FILM TRANSISTOR

(75) Inventors: Je-Hun Lee, Seoul (KR); Jae-Woo Park, Seongnam-si (KR); Byung-Du Ahn, Goyang-si (KR); Sei-Yong Park, Suwon-si (KR); Jun-Hyun Park, Hongcheon-gun (KR)

(73) Assignee: Samsung Display Co., Ltd., Yongin (KR)

( * ) Notice: Subject to any disclaimer, the term of this patent is extended or adjusted under 35 U.S.C. 154(b) by 671 days.

(21) Appl. No.: 13/080,413

(22) Filed: Apr. 5, 2011

(65) Prior Publication Data

US 2011/0284836 A1   Nov. 24, 2011

(30) Foreign Application Priority Data

May 20, 2010   (KR) .................. 10-2010-0047630

(51) Int. Cl.
*H01L 29/10* (2006.01)
*H01L 29/12* (2006.01)
*H01L 29/786* (2006.01)
*H01L 29/45* (2006.01)

(52) U.S. Cl.
CPC ............ *H01L 29/45* (2013.01); *H01L 29/7869* (2013.01); *H01L 29/78696* (2013.01); *H01L 29/78618* (2013.01)
USPC ............................................. 257/43; 257/59

(58) Field of Classification Search
USPC ...................................................... 257/43, 59
See application file for complete search history.

(56) References Cited

U.S. PATENT DOCUMENTS

| | | | | |
|---|---|---|---|---|
| 7,994,579 | B2 * | 8/2011 | Itai | 257/359 |
| 8,203,143 | B2 * | 6/2012 | Imai | 257/43 |
| 8,319,217 | B2 * | 11/2012 | Kim et al. | 257/43 |
| 2009/0134390 | A1 * | 5/2009 | Kodama et al. | 257/43 |
| 2010/0090217 | A1 | 4/2010 | Akimoto | |
| 2010/0148169 | A1 * | 6/2010 | Kim et al. | 257/43 |

FOREIGN PATENT DOCUMENTS

| | | |
|---|---|---|
| JP | 2008-042088 | 2/2008 |
| JP | 2010-021333 | 1/2010 |
| JP | 2010-040552 | 2/2010 |
| JP | 2010-067954 | 3/2010 |
| JP | 2010-087223 | 4/2010 |
| JP | 2010-067710 | 3/2011 |
| KR | 10-2009-0022186 | 3/2009 |
| KR | 10-2009-0065263 | 6/2009 |
| KR | 10-2009-0105558 | 10/2009 |
| KR | 10-2009-0106051 | 10/2009 |

* cited by examiner

Primary Examiner — Phat X Cao
(74) Attorney, Agent, or Firm — H.C. Park & Associates, PLC (57) ABSTRACT

A thin-film transistor includes a gate electrode, a source electrode, a drain electrode, a gate insulation layer and an oxide semiconductor pattern. The source and drain electrodes include a first metal element with a first oxide formation free energy. The oxide semiconductor pattern has a first surface making contact with the gate insulation layer and a second surface making contact with the source and drain electrodes to be positioned at an opposite side of the first surface. The oxide semiconductor pattern includes an added element having a second oxide formation free energy having an absolute value greater than or equal to an absolute value of the first oxide formation free energy, wherein an amount of the added element included in a portion near the first surface is zero or smaller than an amount of the added element included in a portion near the second surface.

19 Claims, 8 Drawing Sheets

OXIDE SEMICONDUCTOR THIN-FILM TRANSISTOR

CROSS REFERENCE TO RELATED APPLICATION

This application claims priority from and benefit of Korean Patent Application No. 2010-47630, filed on May 20, 2010, which is hereby incorporated by reference for all purposes as if fully set forth herein.

BACKGROUND OF THE INVENTION

1. Field of the Invention

Exemplary embodiments of the present invention relate to an oxide semiconductor thin-film transistor (TFT). More particularly, exemplary embodiments of the present invention relate to an oxide semiconductor TFT capable of preventing a reaction between an oxide semiconductor and an electrode material.

2. Discussion of the Background

Generally, a display device includes a plurality of switching elements. The switching elements include a gate electrode connected to a gate line, a semiconductor pattern insulated from the gate electrode, a source electrode connected to a data line to be electrically connected to the semiconductor pattern, and a drain electrode spaced apart from the source electrode. Examples of a TFT used as a switching element of a display device include an amorphous-silicon (a-Si) TFT, a poly-silicon (poly-Si) TFT, and an oxide semiconductor TFT.

The a-Si TFT may be uniformly formed on a large-sized substrate at low cost; however, the a-Si TFT may have low charge mobility. In contrast, the poly-Si TFT may have a higher charge mobility and lower deterioration rate of its element characteristics compared with the a-Si TFT. However, a liquid crystal display (LCD) with the poly-Si TFT may have a more complex manufacturing process than an LCD with an a-Si TFT, which may incur a larger manufacturing cost than the manufacturing cost of an LCD with an a-Si TFT.

The oxide semiconductor TFT may be manufactured using a low temperature process and may be used in a large-sized display panel. In addition, the oxide semiconductor TFT may have relatively large charge mobility. However, an oxide semiconductor may react with substituent components of a source electrode or a drain electrode such as a component metal, thereby inducing oxide semiconductor deoxidation and extraction of a cation included in the oxide semiconductor.

When the oxide semiconductor is reduced with cation extraction, the composition of a channel layer of a TFT changes so that the charge mobility of the TFT decreases. In addition, a threshold voltage temporally varies. Moreover, resistance values of wiring (i.e., gate line and data line resistances) may increase due to metal leaching from the oxide semiconductor. Thus, the TFT may not function due to metal extraction, which may lead to electrical instability and diminish reliability of the switching element.

SUMMARY OF THE INVENTION

Exemplary embodiments of the present invention provide an oxide semiconductor TFT that may prevent a reaction between an electrode or wiring material and an oxide semiconductor material.

Exemplary embodiments of the present invention also provide an oxide semiconductor TFT that may minimize a decrease of carrier mobility within an oxide semiconductor material.

Exemplary embodiments of the present invention further provide an oxide semiconductor TFT that may have increased reliability.

Additional features of the invention will be set forth in the description which follows, and in part will be apparent from the description, or may be learned by practice of the invention.

An exemplary embodiment of the present invention discloses an oxide semiconductor thin-film transistor (TFT) that comprises a gate electrode disposed on a substrate; a source electrode and a drain electrode disposed on the gate electrode and comprising a first metal element with a first oxide formation free energy; a gate insulation layer disposed on the gate electrode and insulating the gate electrode from the source electrode and the drain electrode; and an oxide semiconductor pattern. The oxide semiconductor pattern comprises a first surface contacting the gate insulation layer; a second surface contacting the source electrode and the drain electrode, the second surface disposed opposite the first surface; and an added element with a second oxide formation free energy, the absolute value of the second oxide formation free energy being greater than or equal to the absolute value of the first oxide formation free energy. In the oxide semiconductor pattern, an amount of the added element in a portion proximate to the first surface is zero or smaller than an amount of the added element in a portion proximate to the second surface.

An exemplary embodiment of the present invention also discloses an oxide semiconductor thin-film transistor (TFT) that comprises a gate electrode disposed on a substrate; a source electrode and a drain electrode disposed on the gate electrode and comprising a first metal element; a gate insulation layer disposed on the gate electrode and insulating the gate electrode from the source electrode and the drain electrode; and an oxide semiconductor pattern. The oxide semiconductor pattern comprises an oxide material comprising an ion of at least one of indium (In), gallium (Ga), zinc (Zn), and tin (Sn); a first surface contacting the gate insulation layer; and a second surface contacting the source electrode and the drain electrode. The second surface is disposed opposite the first surface. In the oxide semiconductor pattern, a portion proximal to the second surface further comprises Zn ion, and an amount of Zn ion in a portion proximal to the first surface is zero or smaller than the amount of Zn ion in the portion proximal to the second surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present.

Hereinafter, "deoxidation" refers to chemical deoxidation of an element or dissociation of an element from oxygen such as in breaking a chemical bond between the element and oxygen. The oxygen may be in an oxygen-containing species or unbound in the oxide semiconductor discussed below. Further, the phrase "at least one of," when used with a list of elements, means that the element(s) selected may be just one single element from the list or any combination of two or more elements from the list.

Figure 1:
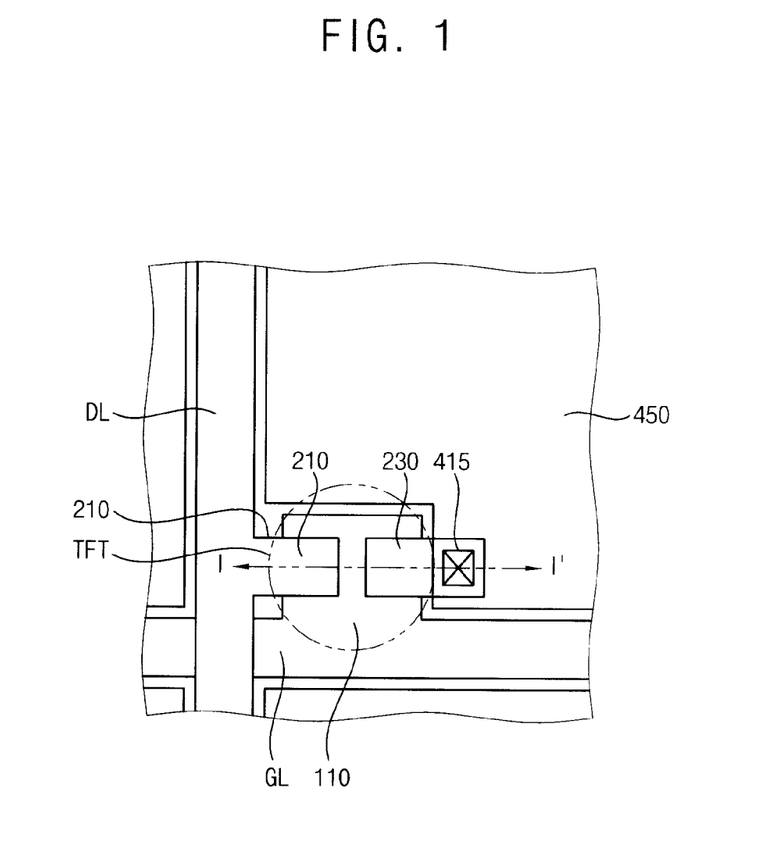
FIG. 1 is a plan view showing an array substrate according to an exemplary embodiment of the present invention.
Figure 2:
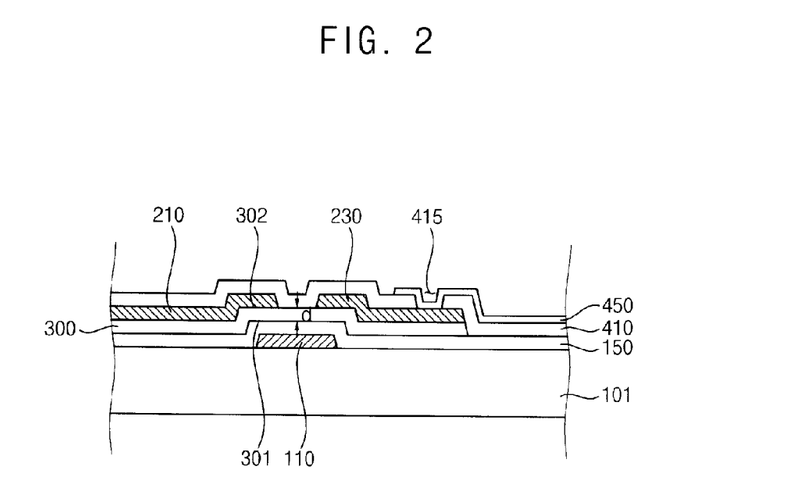
FIG. 2 is a cross-sectional view taken along line I-I' of FIG. 1.

FIG. 1 is a plan view showing an array substrate according to an exemplary embodiment of the present invention. FIG. 2 is a cross-sectional view taken along line I-I' of FIG. 1.

Referring to FIG. 1 and FIG. 2, the array substrate includes a substrate 101, a gate line GL, a data line DL, a thin-film transistor (TFT), and a pixel electrode 450.

The TFT includes a gate electrode 110, a gate insulation layer 150, a semiconductor pattern 300, a source electrode 210, and a drain electrode 230.

The gate electrode 110 is electrically connected to the gate line GL. For example, the gate electrode 110 may protrude from the gate line GL as shown in FIG. 1. In this case, the gate electrode 110 is integrally formed with the gate line GL so that a boundary between the gate electrode 110 and the gate line GL is not obvious. The gate line GL and the gate electrode 110 may be formed from a conductive layer, i.e., a gate conductive layer. The gate electrode 110 may include a metal such as aluminum (Al), copper (Cu), molybdenum (Mo), titanium (Ti), tantalum (Ta), silicon (Si), neodymium (Nd), niobium (Nb), yttrium (Y), scandium (Sc), or a metal alloy thereof. Moreover, the gate electrode 110 may include an optically transparent and electrically conductive material such as indium tin oxide (ITO), indium zinc oxide (IZO), and aluminum-doped zinc oxide (AZO). However, materials of the gate electrode 110 and the gate line GL are not limited to these enumerated materials. For example, the gate electrode 110 and the gate line GL may have a single layer structure. In another example, the gate electrode 110 and the gate line GL may have a multi-layer structure in which plural conductive layers are deposited on the substrate 101 or a combination of plural conductive layers and plural insulation layers are deposited on the substrate 101.

A gate insulation layer 150 covers the gate electrode 110. The gate insulation layer 150 insulates the gate line GL from the data line DL and insulates the gate electrode 110 from the semiconductor pattern 300.

A source electrode 210 is electrically connected to the data line DL. For example, the source electrode 210 may protrude from the data line DL as shown in FIG. 1. The source electrode 210 is electrically connected to the semiconductor pattern 300. A drain electrode 230 is spaced apart from the source electrode 210 and is electrically connected to the semiconductor pattern 300. The data line DL, the source electrode 210, and the drain electrodes 230 may be formed from an identical conductive layer, i.e., a data conductive layer.

For example, the data line DL, the source electrode 210, and the drain electrode 230 may have a single layer structure. In another example, the data line DL, the source electrode 210, and the drain electrode 230 may have a multi-layer structure in which plural conductive layers are deposited on the substrate 101 or a combination of plural conductive layers and plural insulation layers are deposited on the substrate 101. The source electrode 210 and the drain electrode 230 may include, e.g., a metal such as Al, Cu, Mo, Ti, Ta, Nd, Nb, Y, Sc, or a metal alloy thereof.

The array substrate may further include a passivation layer 410 covering the source and drain electrodes 210 and 230. The passivation layer 410 may protect the TFT. The passivation layer 410 may include an inorganic insulation material or an organic insulation material. However, a material of the passivation layer 410 is not limited to these materials.

The pixel electrode 450 is electrically connected to the drain electrode 230. For example, the pixel electrode 450 may be disposed on the passivation layer 410 and may be electrically connected to the drain electrode 230 through a contact hole 415 penetrating the passivation layer 410. The pixel electrode 450 may include an optically transparent and electrically conductive material such as ITO, IZO, and AZO. However, materials of the pixel electrode 450 are not limited to these.

The semiconductor pattern 300 is disposed on the gate insulation layer 150. The semiconductor pattern 300 may be used as a channel layer of the TFT. The semiconductor pattern 300 may include an oxide material having least one element of indium (In), gallium (Ga), zinc (Zn) and tin (Sn). For example, the semiconductor pattern 300 may include an oxide semiconductor material such as a zinc oxide, tin oxide, indium oxide, In—Zn oxide, In—Sn oxide, In—Ga—Zn oxide, In—Zn—Sn oxide, and In—Ga—Zn—Sn oxide. These materials may be used alone or in various combinations. Alternatively, the semiconductor pattern 300 may be an oxide material that has additional elements.

The semiconductor pattern 300 may include an added element having a free energy for oxide formation (hereinafter, referred to as "second oxide formation free energy") whose absolute value is greater than or equal to the absolute value of the free energy for oxide formation (hereinafter, referred to as "first oxide formation free energy") of a metal element included in the source and drain electrodes 210 and 230. The source and drain electrodes 210 and 230 contact the semiconductor pattern 300. Here, the oxide formation free energy denotes the free energy associated with forming an oxide material in the reaction of an oxide with 1 mole of a predetermined element.

Hereinafter, the phrase "added element" means an element (or an ionic form of the element) that is added to the semiconductor pattern 300 with a second oxide formation free energy whose absolute value is greater than or equal to the absolute value of a first oxide formation free energy of a metal element included in the source and drain electrodes 210 and 230. In this exemplary embodiment, the added element does not mean simply an element added in isolation to an oxide semiconductor but, rather, refers to an element or ion added to an oxide semiconductor in consideration of the oxide formation free energy of a metal included in the source metal electrode 210 and the drain electrode 230. The added element may be present in an ionic form or as an oxide.

Table 1 shows oxide formation free energies of various metal elements at about 100° C.

TABLE 1

| Element | Oxide formation free energy [kcal/mol] |
|---|---|
| Pd | −18.5 |
| Cu | −29 |
| Se | −37.7 |
| Te | −47.4 |
| Ni | −48.8 |
| Co | −49.8 |
| Cs | −51 |
| Bi | −56.51 |
| Ru | −57.26 |
| Ge | −61.6 |
| Zn | −74.8 |
| Fe | −86.3 |
| As | −89.2 |
| Re | −90 |
| Sb | −94.8 |
| In | −96.4 |
| Mn | −107.9 |
| Ga | −116.3 |
| Sn | −119.6 |
| Ba | −123.8 |
| Cr | −124 |
| Sr | −133.4 |
| Mg | −134 |
| Ca | −142.4 |
| Mo | −155 |
| V | −165.7 |
| W | −177.9 |
| Al | −186.2 |
| La | −201.3 |
| Si | −201.4 |
| Ce | −201.5 |
| Pr | −202.9 |
| Nd | −203.1 |

TABLE 1-continued

| Element | Oxide formation free energy [kcal/mol] |
|---|---|
| Nb | −207 |
| Ti | −209.3 |
| Y | −214.4 |
| Sc | −214.8 |
| Ta | −224.3 |
| Zr | −245 |
| Hf | −256.7 |

Referring to Table 1, at a temperature of about 100° C., an oxide formation free energy for formation of indium oxide from indium is about $-96.4$ kcal mol$^{-1}$, and the oxide formation free energy for formation of titanium oxide from titanium is about $-209.3$ kcal mol$^{-1}$. That is, an absolute value of oxide formation free energy of Ti is greater than the absolute value of oxide formation free energy of In, i.e., $|\Delta G_{ox}(Ti)|>|\Delta G_{ox}(In)|$.

Since the oxide formation free energies for the metals shown in Table 1 are negative valued, a large absolute value of oxide formation free energy of these metals means that metal oxide formation is thermodynamically favorable. Consequently, Ti forms an oxide more readily than In.

When an oxide semiconductor of the semiconductor pattern 300 includes In, and the source and drain electrodes 210 and 230 include Ti, Ti may be oxidized while an In ion in the oxide semiconductor may be reduced. Therefore, In may be extracted from the oxide semiconductor due to the difference of absolute values between the oxide formation free energy of the In and the oxide formation free energy of Ti. In other words, a deoxidation of In ions in the oxide semiconductor may be coupled to oxidation of Ti included in the source and drain electrodes 210 and 230.

When In or Ga included in the oxide semiconductor is reduced to be extracted, the composition of a channel layer of a TFT may vary, inducing a decrease in charge mobility. In addition, a threshold voltage temporally varies. Moreover, resistance values of the source electrode 210 and the drain electrode 230 may increase due to metal extraction from the oxide semiconductor. Thus, the TFT may not function because of the metal loss, or the switching element may suffer electrical instability and decreased reliability.

As described above, extraction of elements, for example, In or Ga from the oxide semiconductor may be couples to oxidation of a metal in the source and drain electrodes 210 and 230. Therefore, prevention of oxidation of a metal in the source and drain electrodes 210 and 230 that contact the semiconductor pattern 300 is a favorable objective.

According to an exemplary embodiment of the present invention, to prevent oxidation of a metal in the source and drain electrodes 210 and 230 that contact the semiconductor pattern 300, the semiconductor pattern 300 may include an added element having an absolute value of a second oxide formation free energy that is greater than or equal to the absolute value of the first oxide formation free energy for a metal in the source and drain electrodes 210 and 230. For example, when the source and drain electrodes 210 and 230 include Ti, the added element of the semiconductor pattern 300 may include at least one of Ti, Y, Sc, Ta, Zr, and Hf. These elements have an absolute value of a second oxide formation free energy that is greater than or equal to the absolute value of a first oxide formation free energy of Ti.

For an absolute value of a second oxide formation free energy of an added element in the semiconductor pattern 300 is greater than the absolute value of a first oxide formation free energy of a metal in the source and drain electrodes 210 and 230, the added element may be limit or diminish the oxidation of the metal included in the source and drain electrodes 210 and 230. Accordingly, deoxidation or extraction of an ion in the oxide semiconductor may be diminished.

For example, when the source and drain electrodes 210 and 230 include Ti and the semiconductor pattern 300 includes Ta, the absolute value of a second oxide formation free energy of Ta, which is about 224.3 kcal at about 100° C., is greater than the absolute value of a first oxide formation free energy of Ti, which is about 209.3 kcal at about 100° C. Thus, Ta as an added element may decrease the amount of oxidation of the Ti. When oxidation of the Ti is restrained, a deoxidation or an extraction of an ion, e.g., In, in the oxide semiconductor may be concomitantly restrained.

When the source and drain electrodes 210 and 230 include aluminum (Al), the added element of the semiconductor pattern 300 may include at least one of aluminum (Al), lanthanum (La), silicon (Si), cerium (Ce), praseodymium (Pr), neodymium (Nd), niobium (Nb), titanium (Ti), yttrium (Y), scandium (Sc), tantalum (Ta), zirconium (Zr) and hafnium (Hf) having an absolute value of a second oxide formation free energy that is greater than or equal to an absolute value of a first oxide formation free energy of the aluminum (Al). When the source and drain electrodes 210 and 230 include molybdenum (Mo), the added element of the semiconductor pattern 300 may include at least one of molybdenum (Mo), vanadium (V), tungsten (W), aluminum (Al), lanthanum (La), silicon (Si), cerium (Ce), praseodymium (Pr), neodymium (Nd), niobium (Nb), titanium (Ti), yttrium (Y), scandium (Sc), tantalum (Ta), zirconium (Zr) and hafnium (Hf) having an absolute value of a second oxide formation free energy that is greater than or equal to an absolute value of a first oxide formation free energy of the molybdenum (Mo).

Figure 3:
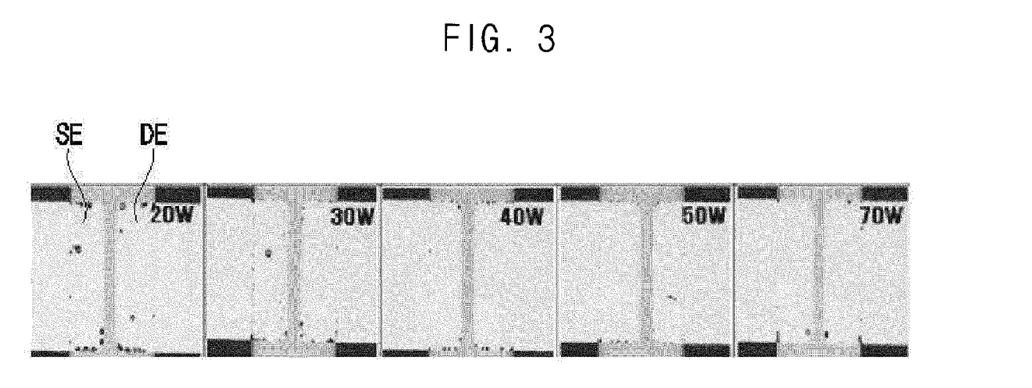
FIG. 3 shows photographs of the decrease in the amount of metal extracted from an oxide semiconductor corresponding to an increase in an amount of an added element in an oxide semiconductor.

FIG. 3 shows photographs of the decrease in the amount of a metal extracted from an oxide semiconductor corresponding to an increase in an amount of an added element included in the oxide semiconductor. In FIG. 3, the source electrode and the drain electrode are represented by reference labels "SE" and "DE," respectively.

In the photographs, a Si-doped donor was used as the gate electrode, and silicon oxide (SiOx) having a thickness of about 1 μm was used as the gate insulation layer. In addition, Zn—Sn oxide was used as an oxide semiconductor forming the channel layer, and titanium (Ti) and platinum (Pt) having a very low reactivity were used as source-drain electrodes.

Tantalum (Ta) as an added element was introduced into the Zn—Sn oxide semiconductor in a radio frequency (RF)-magnetron sputtering process using a tantalum oxide ($Ta_2O_3$) target. In FIG. 3, about 20 watts, about 30 watts, about 40 watts, about 50 watts, and about 70 watts of RF power was supplied during sputtering to vary the amount of Ta delivered to the Zn—Sn oxide semiconductor. As the RF power increases, the amount of Ta added in the Zn—Sn oxide semiconductor increases.

A heat treatment process for the five samples shown in the photographs in FIG. 5 was performed in an air atmosphere at about 350° C. for about one hour. The migration of ions in the Zn—Sn oxide semiconductor due to their deoxidation and extraction was photographed using electron microscopy.

In FIG. 3, black spots on the source and the drain electrodes SE and DE indicate that ions in the Zn—Sn oxide semiconductor are reduced and extracted upon oxidation of Ti in the source and drain electrodes SE and DE by the oxide semiconductor. The number of black spots decreases as the amount of Ta is added to the oxide semiconductor, which occurs with increasing RF power of the sputter source. That is, increasing the amount of Ta present in the oxide semiconductor via, e.g., sputtering, increases the amount of ions in the oxide semiconductor left oxidized, i.e., non-reduced, and, therefore, not extracted. In other words, when Ta, which has an absolute value of an oxide formation free energy greater than the absolute value of an oxide formation free energy of Zn or Sn, was included in the Zn—Sn oxide semiconductor, the deoxidation or extraction of ions included in the oxide semiconductor may be restrained.

Figure 4:
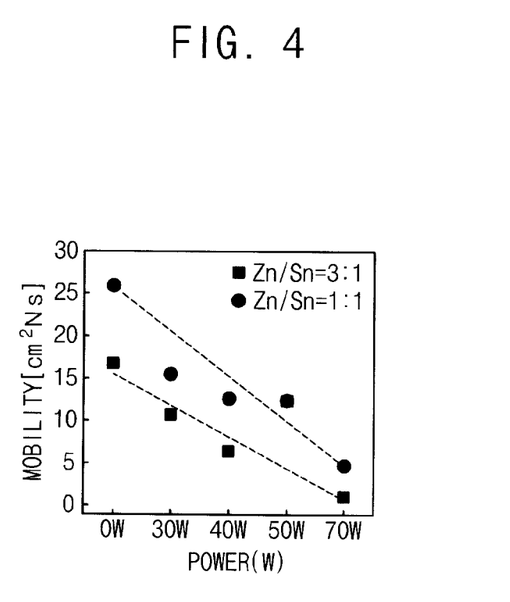
FIG. 4 is a graph showing the relationship between RF power during sputtering and charge carrier mobility in an oxide semiconductor.

FIG. 4 is a graph showing a relationship between RF power during sputtering and charge carrier mobility in an oxide semiconductor. The data in FIG. 4 corresponds to conditions used in the photographs shown in FIG. 3.

In the graph shown in FIG. 4, the horizontal axis indicates the RF power during used in the RF-magnetron sputtering process, and the vertical axis indicates the mobility of a charge carrier within the respective oxide semiconductor, which is either Zn—Sn in a 3:1 ratio (closed square symbols) or 1:1 ratio (closed circular symbols). Charge mobility is the area that a carrier traverses per unit time and unit voltage and has units of $cm^2/Vsec$.

According to FIG. 4, as the amount of Ta added to the oxide semiconductor increases, reflected by increasing RF power, the mobility decreases. That is, when the amount of the added element, e.g., Ta, in the oxide semiconductor increases, the mobility within the semiconductor decreases and reduces the electrical characteristics or functions of a TFT.

As described above, a deoxidation of a metal in the semiconductor pattern 300 may be restrained so that a deoxidation or an extraction of ion included in the semiconductor pattern 300 may be restrained. However, when the semiconductor pattern 300 greatly includes the added element, the mobility within an oxide semiconductor may be greatly decreased so that electric characteristics or function of a TFT may be reduced. Thus, an amount of the added element may be smaller than that of major elements included in the oxide semiconductor of the semiconductor pattern 300 such as indium (In), gallium (Ga), zinc (Zn), tin (Sn), etc.

However, when an amount of the added element is decreased so as to increase mobility, the oxidation of a metal in the source and drain electrodes 210 and 230 may increase. In addition, a deoxidation restraining effect or an extraction restraining effect of an ion included in the oxide semiconductor pattern 300 may decrease. Thus, minimizing the mobility decrease of the oxide semiconductor without decreasing the positive effects of the added element, i.e., restraining extraction of an ion in the oxide semiconductor pattern 300, is beneficial.

Hereinafter, a surface of the semiconductor pattern 300 that contacts the gate insulation layer 150 is called a first surface 301, and a surface of the semiconductor pattern 300 that contacts the source and drain electrodes 210 and 230 is called a second surface 302. The second surface 302 opposes the first surface 301.

Since the added element may play a role in restraining oxidation of a metal in the source and drain electrodes 210 and 230, the added element may be distributed at a portion near the second surface 302 of the semiconductor pattern 300.

Since the first surface 301 of the semiconductor pattern 300 does not contact the source and drain electrodes 210 and 230, restraining the oxidization of a metal in the source and drain electrodes 210 and 230 may not occur even if a portion near the first surface 301 includes the added element in a relatively small amount. When the portion near the first surface 301 includes the added element in a relatively small amount, a decrease of mobility within the oxide semiconductor pattern 300 may be prevented. Accordingly, a distribution of the added element included in the semiconductor pattern 300 may be adjusted so that a decrease of mobility within the oxide semiconductor may be minimized.

According to an exemplary embodiment of the present invention, an amount of the added element included in a portion near the first surface 301 of the semiconductor pattern 300 is zero or smaller than an amount of the added element included in a portion near the second surface 302 of the semiconductor pattern 300. Hereinafter, the term "an amount of an added element is zero" means that the added element is not included in the semiconductor pattern 300. Further, the added element may not be distributed uniformly in the semiconductor pattern 300 but may be present in higher concentrations near the second surface 302 contacting the source and drain electrodes 210 and 230 rather than the first surface 301 contacting the gate insulation layer 150 within the semiconductor pattern 300. Moreover, a portion near the first surface 301 contacting the gate insulation layer 150 may not include the added element.

Figure 5A:
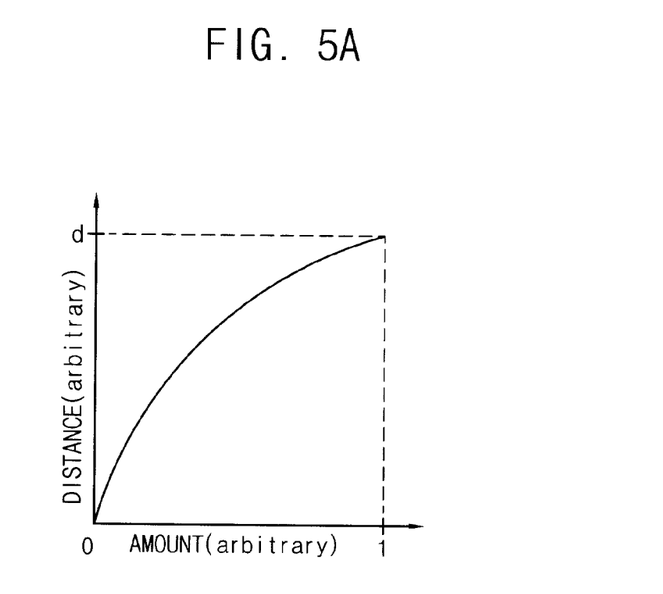
FIG. 5A and FIG. 5B are graphs showing a relationship between an amount of an element added to an oxide semiconductor and distance from a first surface of the oxide semiconductor pattern shown in FIG. 2.
Figure 5B:
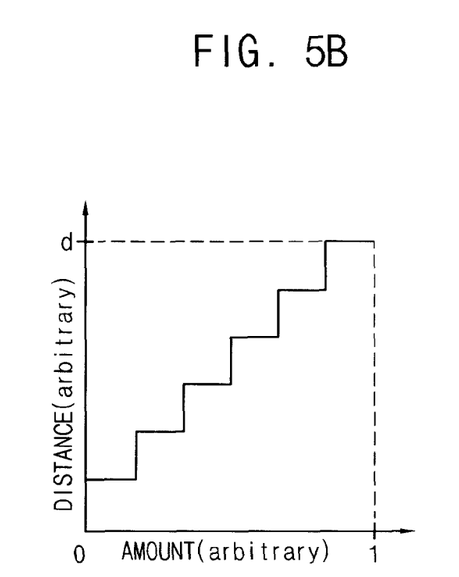
Figure 6A:
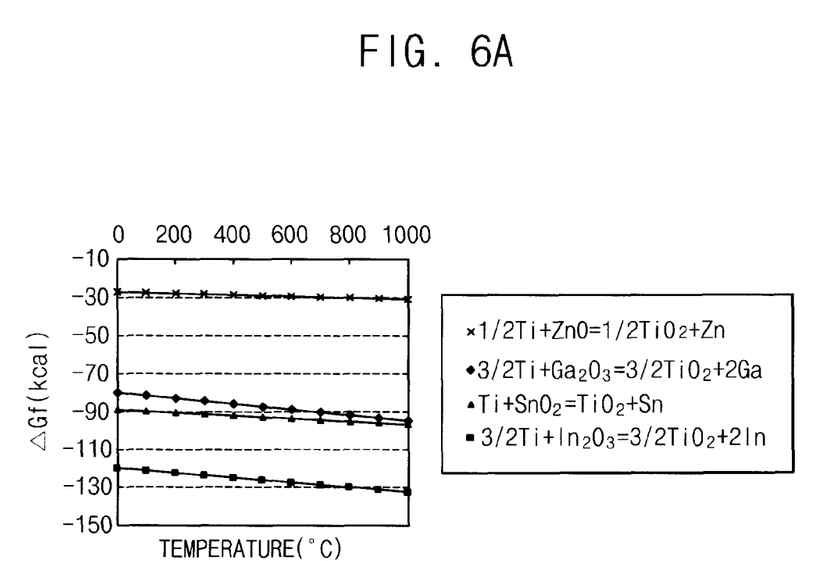
FIG. 6A, FIG. 6B, FIG. 6C and FIG. 6D are graphs showing free energy associated with metal oxide formation in the reaction of various metals with 1 mole of an oxide material of indium (In), gallium (Ga), zinc (Zn) and tin (Sn).
Figure 6B:
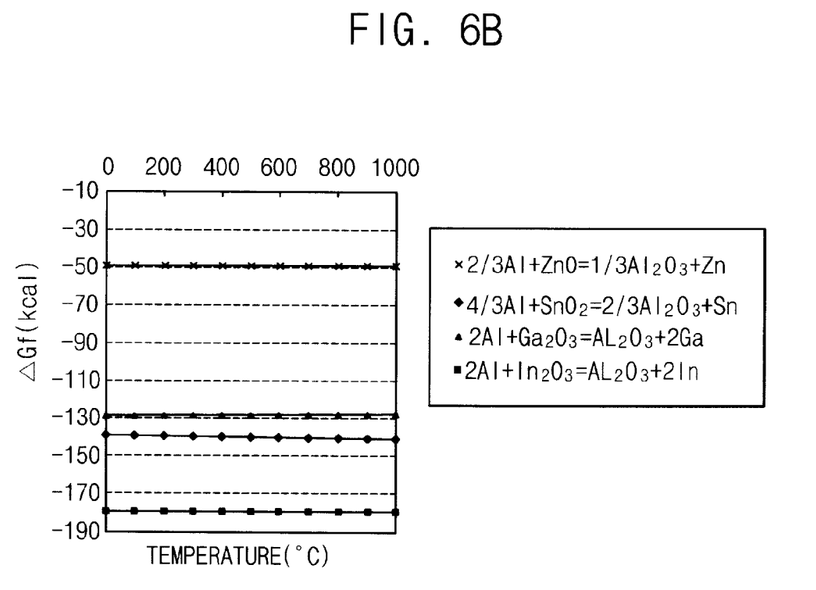
Figure 6C:
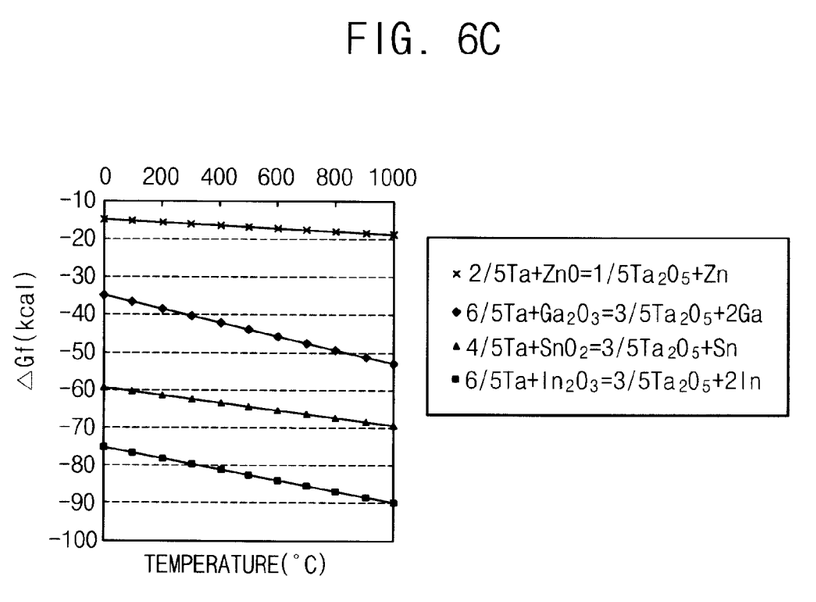
Figure 6D:
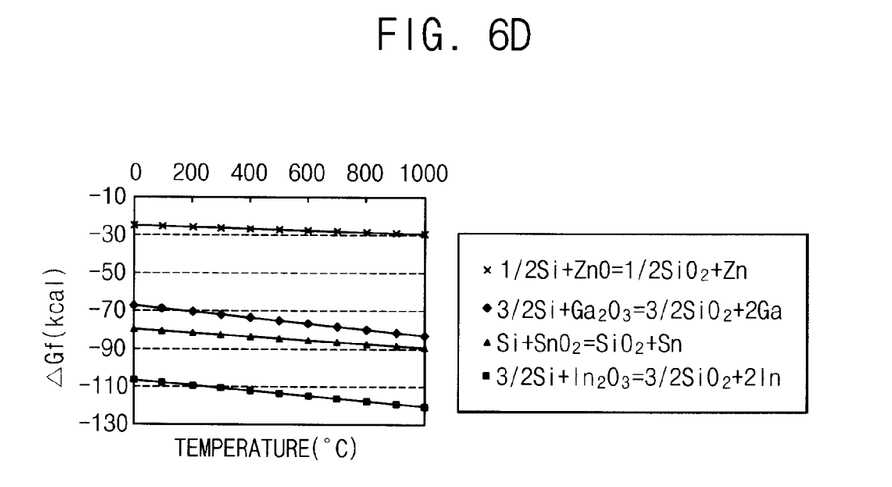

FIG. 5A and FIG. 5B are graphs showing a relationship between an amount of an added element in an oxide semiconductor and a distance from a first surface of an oxide semiconductor pattern shown in FIG. 2.

In FIG. 5A and FIG. 5B, the vertical axes indicate a distance from the first surface 301 within the semiconductor pattern 300, and the horizontal axes indicate an amount of Zn in the semiconductor pattern 300. The term "d" indicates a thickness of the semiconductor pattern 300 or a distance between the first surface 301 and the second surface 302, as shown in FIG. 2. The distance and amount may have an arbitrary unit representing a relative amount.

In an exemplary embodiment, the amount of the added element in the semiconductor pattern 300 may be gradually decreased near the first surface 301 away from the second surface 302, as shown in FIG. 5A.

The amount of the added element in the semiconductor pattern may gradually decrease near the first surface 301 away from the second surface 302 through an annealing process. For example, when the added element is formed at the second surface 302 of the semiconductor pattern 300 through a sputtering process using a target including an oxide material of the added element followed by annealing for about ten minutes to about four hours in an air atmosphere or a nitrogen atmosphere in a temperature range of about 200° C. to about 400° C., the added element at the second surface 302 diffuses in the semiconductor pattern 300 toward the first surface 301. When the annealing time is extremely long, the added element may be uniformly distribute in the semiconductor pattern 300 so that the added element may not establish a concentration gradient in the semiconductor pattern 300. Thus, the annealing temperature and time may be adjusted according to the identity of the added element, the material of the oxide semiconductor, and a reaction speed of the added element.

In another exemplary embodiment, the amount of the added element included in the semiconductor pattern 300 may be decreased in a step-like fashion with respect to the first and second surfaces 301 and 302 as shown in FIG. 5B. For example, when plural sub-semiconductor patterns including added elements of the different amounts are deposited thereon, a structure in which the amount of the added element is decreased in a step shape as the sub-semiconductor patterns become near the first surface 301 from the second surface 302 may be realized.

A distribution of the added element included in the semiconductor pattern 300 shown in FIG. 5A and FIG. 5B is described as an example. However, the distribution of the added element in the semiconductor pattern 300 is not limited to the profiles shown in FIG. 5A and FIG. 5B. That is, when an amount of the added element included in a portion near the first surface 301 is zero or smaller than an amount of the added element included in a portion near the second surface 302, the distribution of the added element may be varied in many ways.

FIG. 6A, FIG. 6B, FIG. 6C and FIG. 6D are graphs showing free energy associated with oxide formation by reaction of various metals with 1 mole of an oxide material of In, Ga, Zn, and Sn.

In the graphs shown in FIG. 6A, FIG. 6B, FIG. 6C and FIG. 6D, a lower portion of a vertical axis indicates that an absolute value of an oxide formation free energy is large, and an upper portion of the vertical axis indicates that the absolute value of an oxide formation free energy is small. When the absolute value of the oxide formation free energy associated with reacting a metal with 1 mole of another metal oxide is great, i.e., the lower portion of the vertical axis, a tendency for becoming an oxide material is great. In other words, when the absolute value of the oxide formation free energy is large, a tendency for a deoxidation of a metal ion included in the oxide metal co-reactant is large.

Referring to FIG. 6A, FIG. 6B, FIG. 6C and FIG. 6D, for indium oxide, gallium oxide, zinc oxide and tin oxide, indium oxide tends to react with metals such as Ti, Al, and Ta and non-metals such as Si to be reduced to indium. Moreover, the melting point of In is about 157° C., which is lower than a process temperature range of a following process such as a heat treatment process that may occur in the temperature range from about 250° C. to about 350° C. Thus, when indium ion that may be in an oxide semiconductor reacts with a metal in the source and drain electrodes 210 and 230 to be reduced, the indium ion may be eluted in a liquid following a process such as a heat treatment process. When an ion included on an oxide semiconductor is eluted in a liquid, a reliability of a TFT may be decreased or a switching function may be stopped.

A tendency for gallium ion included in an oxide semiconductor to react with a metal included in the source and drain electrodes 210 and 230 is smaller than a tendency for indium ion to react with the metal included in the source and drain electrodes 210 and 230. However, a melting point of gallium is about 29° C., which is much lower than a temperature range of about 250° C. to about 350° C., the process temperature range of a following process such as a heat treatment process. Thus, when a gallium ion reacts with a metal included in the source and drain electrodes 210 and 230 to be deoxidized, the gallium ion may be eluted in a liquid when the following process is a heat treatment process.

In contrast, the tendency for zinc oxide to react with a metal such as Ti, Al, and or non-metal such as Si to form Zn is very small. The melting point of Zn is about 420° C., which is much higher than a temperature range of about 250° C. to about 350° C., the process temperature range of a following process such as a heat treatment process. Thus, although zinc ion may react with a metal included in the source and drain electrodes 210 and 230 to become deoxidized, the zinc ion may not be eluted in a liquid when the following process is performed. Therefore, when the oxide semiconductor of the semiconductor pattern 300 includes zinc ion, regardless of an oxide formation free energy of a metal included in the source and drain electrodes 210 and 230, oxidation of the metal may be restrained.

Although not shown in FIG. 6A, FIG. 6B, FIG. 6C and FIG. 6D, a tendency of oxide formation free energy required to form a metal oxide by reacting a metal such as Nd, Nb, Y, and Sc with 1 mole of an oxide material of In, Ga, Zn, and Sn is similar with that of metals such as Ti, Al, and Ta and non-metals such as Si as shown in FIG. 6A, FIG. 6B, FIG. 6C and FIG. 6D.

Figure 7:
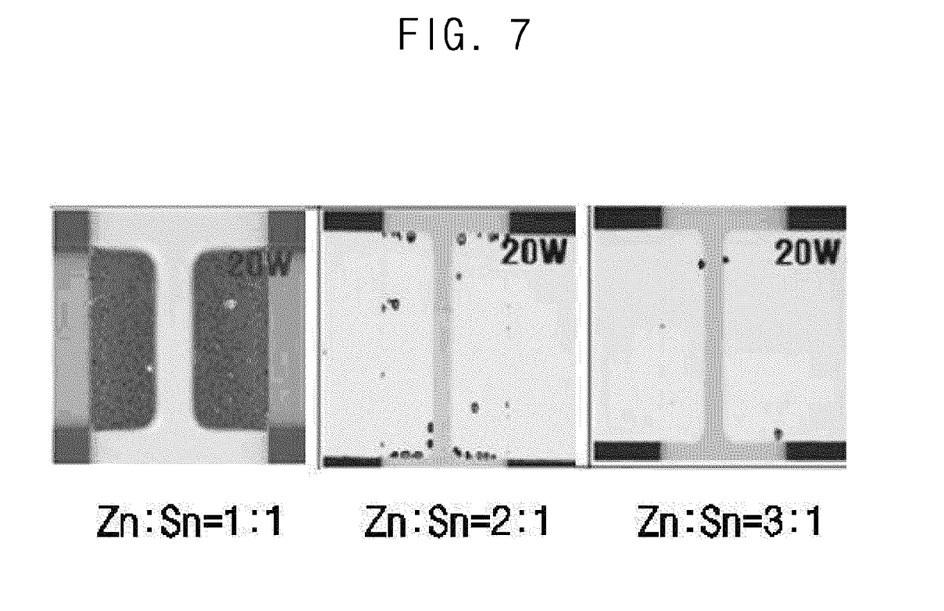
FIG. 7 shows photographs of a decrease in a metal amount extracted from an oxide semiconductor that corresponds to an increase of an amount of zinc ion included in an oxide semiconductor.

FIG. 7 shows photographs of a decrease in the metal amount extracted from an oxide semiconductor that corresponds to an increase in the amount of zinc ion included in the oxide semiconductor.

In the photographs of FIG. 7, a Si-doped donor was used as the gate electrode, and SiOx having a thickness of about 1 μm was used as the gate insulation layer. In addition, Zn—Sn oxide was used as an oxide semiconductor forming the channel layer, and Ti and Pt having a very low reactivity towards oxidation were used as source-drain electrodes. In this case, three samples in which content ratios of zinc ion and tin ion included in the Zn—Sn oxide semiconductor are respectively about 1:1, about 2:1, and about 3:1 were prepared.

A heat treatment process for the three samples was performed in an air atmosphere at about 350° C. for about one hour, and then an amount of ions included in the Zn—Sn oxide semiconductor that have been deoxidized and extracted were photographed using electron microscopy.

In FIG. 7, black spots on the source and drain electrodes SE and DE represent ions included in the Zn—Sn oxide semiconductor that are deoxidized and extracted by oxidizing Ti in the source and drain electrodes SE and DE with the oxide semiconductor.

Many black spots are present when a content ratio of zinc ions and tin ions is about 1:1. However, the number of black spots greatly diminishes when a content ratio of zinc ions and tin ions is about 3:1. That is, the amount of ions included in the oxide semiconductor that become deoxidized to be extracted decreases, as the amount of zinc ion in the oxide semiconductor increases. In other words, the extraction of ions in the oxide semiconductor may be restrained as zinc ion is further added in the oxide semiconductor.

Referring again to the graph of FIG. 4, the mobility corresponding to a content ratio of zinc ion and tin ion of about 3:1 is smaller than the corresponding content ratio of zinc ion and tin ion of about 1:1. As the amount of zinc ion added to the oxide semiconductor increases, mobility decreases. When the amount of zinc ion added to the oxide semiconductor reaches a relatively large amount, the mobility within the semiconductor may be decreased to such an extent that the electrical characteristics and functions of a TFT may be reduced.

Since the first surface 301 of the semiconductor pattern 300 does not contact the source and drain electrodes 210 and 230, an effect of restraining oxidation of a metal included in the source and drain electrodes 210 and 230 may not be reduced even though zinc (Zn) ion is included in a relatively small amount in near the first surface 301 of the semiconductor pattern 300. When a portion near the first surface 301 does not include the added element or includes the added element in a relatively small amount, a decrease of mobility within the oxide semiconductor pattern 300 may be prevented. Accordingly, a distribution of zinc ion further added in the semiconductor pattern 300 may be adjusted so that a decrease of mobility within the oxide semiconductor may be minimized.

In accord with the above description, regardless of a first oxide formation free energy of a metal included in the source and drain electrodes 210 and 230, zinc ion may be further added to a portion near the second surface 302 contacting the source and drain electrodes 210 and 230 so that an oxidation of the metal included in the source and drain electrodes 210 and 230 may be restrained. When the semiconductor pattern 300 includes an oxide material including an ion of an element of at least one of In, Ga, Zn, and Sn, an amount of zinc ion included in a portion near the first surface 301 contacting the gate insulation layer 150 may be zero or smaller than an amount of zinc ion included in a portion near the second surface 302 contacting the source and drain electrodes 210 and 230. For example, a portion near the first surface 301 may include indium oxide and exclude zinc, and a portion near the second surface 302 may include In—Zn oxide or In—Zn—Sn oxide. Moreover, the semiconductor pattern 300 may have a double layer structure in which a portion near the first surface 301 includes indium oxide, and a portion near the second surface 302 includes In—Zn oxide or In—Zn—Sn oxide.

An amount of zinc ion in the semiconductor pattern 300 may be gradually decreased traversing the semiconductor pattern 300 near the first surface 301 away from the second surface 302, as shown in FIG. 5A. Alternatively, an amount of zinc ion in the semiconductor pattern 300 may step-wise decrease within the semiconductor pattern 300 near the first surface 301 away from the second surface 302, as shown in FIG. 5B.

A distribution of zinc ion included in the semiconductor pattern 300 shown in FIG. 5A and FIG. 5B is described as an example. However, the distributions shown in FIG. 5A and FIG. 5B does not limit distributions in exemplary embodiments. That is, when an amount of zinc ion in a portion near the first surface 301 is zero or smaller than an amount of zinc ion in a portion near the second surface 302, the distribution of zinc ion may vary throughout the semiconductor pattern 300.

In another exemplary embodiment, an amount of the added element having an absolute value of a second oxide formation free energy that is greater than or equal to an absolute value of a first oxide formation free energy of the first metal element may be adjusted in addition to adjustment of a distribution of the zinc ion in the semiconductor pattern 300. For example, amounts of the added element and an amount of zinc ion in a portion near the first surface 301 may be zero or smaller than an amount of the added element and a content of the zinc ion in a portion near the second surface 302. Thus, when a distribution of the zinc ion is adjusted, there may also be present an increased amount of the added element to minimize a decrease of mobility within the oxide semiconductor. In addition, an oxidation of a metal in the source and drain electrodes 210 and 230 reacting with the oxide semiconductor may be restrained.

Figure 8:
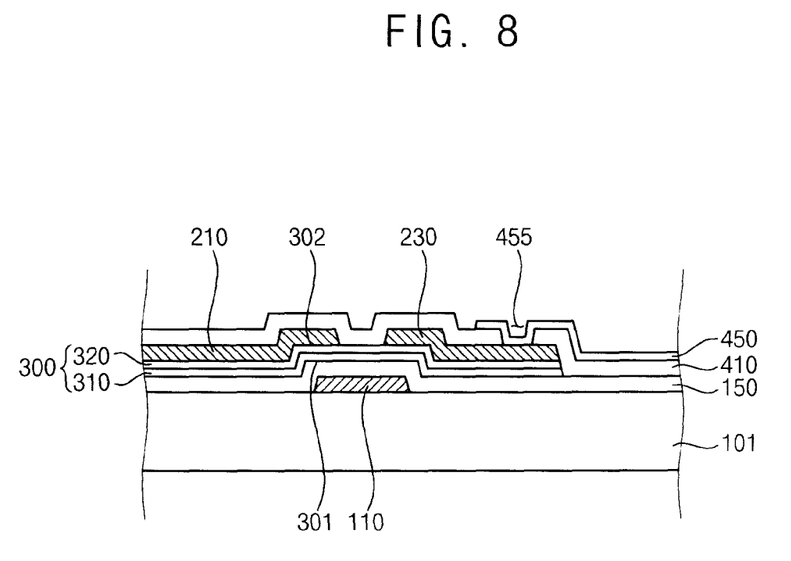
FIG. 8 is a cross-sectional view of an oxide semiconductor TFT according to another exemplary embodiment of the present invention.

FIG. 8 is a cross-sectional view of an oxide semiconductor TFT according to another exemplary embodiment of the present invention.

The TFT of FIG. 8 is substantially the same as the TFT show in FIG. 1 and FIG. 2 except that the semiconductor pattern 300 has a double layer structure. Thus, the same reference numerals will be used to refer to the same or like parts as those described in FIG. 1 and FIG. 2, and repeated explanation is omitted or simplified.

Referring to FIG. 8, the TFT includes a gate electrode 110, a gate insulation layer 150, a semiconductor pattern 300, a source electrode 210, and a drain electrode 230.

The semiconductor pattern 300 has a double layer structure in which a first sub-semiconductor pattern 310 and a second sub-semiconductor pattern 320 are disposed. The first semiconductor pattern 310 has a first surface 301 contacting the gate insulation layer 150, and the second sub-semiconductor pattern 320 has a second surface 302 contacting the source and drain electrodes 210 and 230. That is, the first sub-semiconductor pattern 310 is disposed to contact the gate insulation layer 150, and the second sub-semiconductor pattern 320 is disposed to contact with the source and drain electrodes 210 and 230.

According to an exemplary embodiment of the present invention, to prevent an oxidation of a metal in the source and drain electrodes 210 and 230 contacting the semiconductor pattern 300, the second sub-semiconductor pattern 320, which contacts the source electrode 210 and 230, may include an added element having an absolute value of a second oxide formation free energy that is greater than or equal to an absolute value of the first oxide formation free energy of the metal in the source and drain electrodes 210 and 230. For example, when the source and drain electrodes 210 and 230 include Ti, the added element of the second sub-semiconductor pattern 320 may include at least one of Ti, Y, Sc, Ta, Zr, and Hf having an absolute value of a second oxide formation free energy that is greater than or equal to an absolute value of a first oxide formation free energy of the Ti.

As described above, the added element, which has an absolute value of a second oxide formation free energy that is greater than or equal to an absolute value of the first oxide formation free energy of a metal included in the source and drain electrodes 210 and 230, is added in the second sub-semiconductor pattern 320 so that an oxidation of a metal included in the source and drain electrodes 210 and 230 may be restrained. An extraction due to a deoxidation of an ion such as indium (In) or gallium (Ga) included in the oxide semiconductor is caused by an oxidation of a metal included in the source and drain electrodes 210 and 230. Thus, when the added element restrains an oxidation of a metal included in the source and drain electrodes 210 and 230, a deoxidation or an extraction of an ion included in the oxide semiconductor may be restrained. A principle of restraining an oxidation of a metal included in the source and drain electrodes 210 and 230 by inclusion of the added element and restraining an extraction of an ion in the oxide semiconductor is described above, and repetitive details are omitted or simplified.

When the oxide semiconductor includes a large quantity of the added element, the mobility within the oxide semiconductor may be greatly decreased so that electrical characteristics or functions of a TFT may be reduced. Thus, an amount of the added element included in the first sub-semiconductor pattern 310 spaced apart from the source and drain electrodes 210 and 230 may be zero or smaller than an amount of the added element included in the second sub-semiconductor pattern 320.

Since the first sub-semiconductor pattern 310 does not contact the source and drain electrodes 210 and 230, an effect of restraining an oxidation of a metal included in the source and drain electrodes 210 and 230 is not reduced even though the first sub-semiconductor pattern 310 may not include the added element or may include the added element in a relatively small amount. That is, when the first sub-semiconductor pattern 310 does not include the added element or does include the added element but in a relatively small amount, a decrease of mobility within the oxide semiconductor may be prevented.

As described above, the semiconductor pattern 300 is divided into the first sub-semiconductor pattern 310 spaced apart from the source and drain electrodes 210 and 230 and the second sub-semiconductor pattern 320 contacting the source and drain electrodes 210 and 230, and a distribution of the added element in the second sub-semiconductor pattern 320 may be adjusted so that a decrease of mobility within the oxide semiconductor may be minimized.

When the two sub-semiconductor patterns 310 and 320 having different amounts of the added element are deposited to form the semiconductor pattern 300, even though the added element may be uniformly distributed within each of the sub-semiconductor patterns 310 and 320, a decrease of mobility within the oxide semiconductor may be minimized. In addition, restraining a deoxidation of an ion included in the oxide semiconductor may be achieved. That is, in a manufacturing process of the sub-semiconductor patterns 310 and 320, diffusion of the added element is not required to adjust a distribution of the added element, which may simplify the manufacturing process of the semiconductor pattern 300.

In another exemplary embodiment of the present invention, regardless of a first oxide formation free energy of a metal included in the source and drain electrodes 210 and 230, zinc ion may be further added to the second semiconductor pattern 320 to restrain oxidation of the metal in the source and drain electrodes 210 and 230. Restraining oxidation of a metal in the source and drain electrodes 210 and 230 by adding zinc ion to the oxide semiconductor and restraining extraction of an ion in the oxide semiconductor is described above, and repetitive explanation is omitted or simplified.

In this case, an amount of zinc ion in the first sub-semiconductor pattern 310 may be zero or smaller than an amount of zinc ion in the second sub-semiconductor pattern 320. For example, the first sub-semiconductor pattern 310 may include indium oxide in which Zn is not included, and the second sub-semiconductor pattern 320 may include In—Zn oxide or In—Zn—Sn oxide. Alternatively, the first sub-semiconductor pattern 310 may include indium oxide in which Zn is not included, and the second sub-semiconductor pattern 320 may include Zn—Sn oxide.

As described above, the semiconductor pattern 300 is layered into the first sub-semiconductor pattern 310 and the second sub-semiconductor pattern 320, and distributions of zinc ion respectively in the first and second sub-semiconductor patterns 310 and 320 are individually adjusted so that a decrease of mobility within the oxide semiconductor may be minimized.

In another exemplary embodiment, not only may the distribution amount of the zinc ion be adjusted but adjustment may be made of an amount of the added element having an absolute value of a second oxide formation free energy that is greater than or equal to an absolute value of a first oxide formation free energy of the metal element in the source and drain electrodes 210 and 230. For example, an amount of the added element and an amount of zinc ion in the first sub-semiconductor pattern 310 may be zero or smaller than an amount of the added element and an amount of the zinc ion in the second sub-semiconductor pattern 320. Thus, when a distribution of the zinc ion is adjusted together with a distribution of the added element, a decrease of mobility within the oxide semiconductor may be minimized. In addition, an oxidation of a metal included in the source and drain electrodes 210 and 230 caused by reacting with the oxide semiconductor may be restrained.

Figure 9:
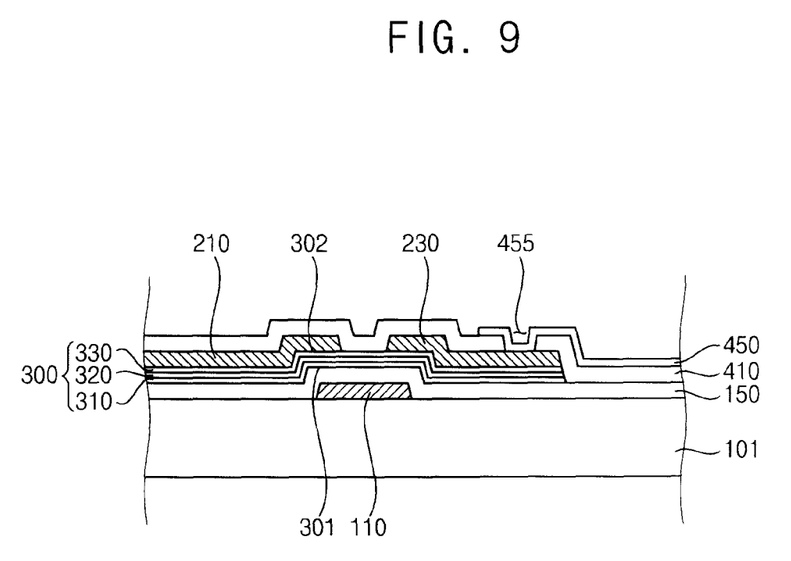
FIG. 9 is a cross-sectional view of an oxide semiconductor TFT according to another exemplary embodiment of the present invention.

FIG. 9 is a cross-sectional view of an oxide semiconductor TFT according to another exemplary embodiment of the present invention.

The TFT of FIG. 9 is similar to the TFT of FIG. 1, FIG. 2, and FIG. 8 except that the semiconductor pattern 300 has at least a triple layer structure. Thus, the same reference numerals will be used to refer to the same or like parts as those described in FIG. 1, FIG. 2, and FIG. 8, and repetitive descriptions are omitted or simplified.

Referring to FIG. 9, the TFT includes a gate electrode 110, a gate insulation layer 150, a semiconductor pattern 300, a source electrode 210 and a drain electrode 230.

The semiconductor pattern 300 has a triple layer structure in which a first sub-semiconductor pattern 310, a second sub-semiconductor pattern 320, and a third sub-semiconductor pattern 330 are disposed.

The first sub-semiconductor pattern 310 has a first surface 301 contacting the gate insulation layer 150, and the third sub-semiconductor pattern 330 has a second surface 302 contacting the source and drain electrodes 210 and 230. That is, the first sub-semiconductor pattern 310 is disposed to contact the gate insulation layer 150, and the third sub-semiconductor pattern 330 is disposed to contact the source and drain electrodes 210 and 230. The second sub-semiconductor pattern 320 is disposed between the first sub-semiconductor pattern 310 and the third sub-semiconductor pattern 330.

According to an exemplary embodiment of the present invention, in order to prevent oxidation of a metal in the source and drain electrodes 210 and 230 that contact the semiconductor pattern 300, the third sub-semiconductor pattern 330, which contacts with the source electrode 210 and 230, may include an added element having an absolute value of a second oxide formation free energy that is greater than or equal to an absolute value of the first oxide formation free energy of the metal in the source and the drain electrodes 210 and 230. The added element may be added to the third sub-semiconductor pattern 330 so that oxidation of the metal included in the source and drain electrodes 210 and 230 may be restrained. Moreover, when oxidation of the metal included in the source and drain electrodes 210 and 230 is restrained by the added element, an extraction of an ion in the oxide semiconductor may be restrained. Restraining oxidation of a metal included in the source and drain electrodes 210 and 230 by the added element and restraining an extraction of an ion in the oxide semiconductor is described above, and repetitive explanations are omitted or simplified.

When the oxide semiconductor includes a large amount of the added element, the mobility within the oxide semiconductor may be greatly decreased so that electrical characteristics or function of a TFT may be reduced. Thus, an amount of the added element in the second sub-semiconductor pattern 320 spaced apart from the source and drain electrodes 210 and 230 may be zero or smaller than an amount of the added element included in the third sub-semiconductor pattern 330. Moreover, an amount of the added element included in the first sub-semiconductor pattern 310 spaced apart from the source and drain electrodes 210 and 230 may be zero or smaller than an amount of the added element included in the second and third sub-semiconductor patterns 320 and 330. In other words, the semiconductor pattern 300 may have three sub-semiconductor patterns 310, 320 and 330, and an amount of the added element, which is included in a sub-semiconductor pattern, i.e., the first sub-semiconductor pattern 310, disposed near the first surface 301 contacting the gate insulation layer 150, may be smaller than an amount of the added element included in another sub-semiconductor pattern, e.g., the third sub-semiconductor pattern 330, near the second surface 302.

Since the first sub-semiconductor pattern 310 and the second sub-semiconductor pattern 320 do not contact the source and drain electrodes 210 and 230, restraining oxidation of the metal in the source and drain electrodes 210 and 230 may not decrease even though the first sub-semiconductor pattern 310 or the second sub-semiconductor pattern 320 may include the added element in a relatively small amount.

For example, an amount of the added element may be zero in a sub-semiconductor pattern, e.g., the first sub-semiconductor pattern 310, disposed near the first surface 301 contacting the gate insulation layer 150.

In another exemplary embodiment of the present invention, regardless of a first oxide formation free energy of a metal included in the source and drain electrodes 210 and 230, zinc ion may be added to the third semiconductor pattern 330 contacting the source and drain electrodes 210 and 230 so that oxidation of the metal included in the source and drain electrodes 210 and 230 may be restrained. Restraining oxidation of a metal included in the source and drain electrodes 210 and 230 by adding zinc ion to the oxide semiconductor and restraining an extraction of an ion in the oxide semiconductor is described above, and repetitive explanations are omitted or simplified.

In this case, an amount of zinc ion in the first sub-semiconductor pattern 310 may be zero or smaller than an amount of zinc ion in the second sub-semiconductor pattern 320. Accordingly, the semiconductor pattern 300 may be divided into plural sub-semiconductor patterns 310, 320 and 330, and distributions of zinc ion in the plural sub-semiconductor patterns 310, 320 and 330 may be separately adjusted so that a decrease of mobility within the oxide semiconductor may be minimized.

In FIG. 9, three sub-semiconductor patterns 310, 320 and 330 are shown; however, the semiconductor pattern is not limited to just this exemplary embodiment. For example, when the semiconductor pattern 300 has a multi-layer structure with four sub-semiconductor patterns or five sub-semiconductor patterns, effects by the multi-layer structure on the restraints of oxidation and extraction discussed above may be substantially similar to the exemplary embodiment shown in FIG. 9.

In another exemplary embodiment, an amount of the added element having an absolute value of a second oxide formation free energy that is greater than or equal to an absolute value of a first oxide formation free energy of the metal element in the source and drain electrodes 210 and 230 may be adjusted together with a distribution of the zinc ion. For example, an amount of the added element and an amount of zinc ion in a sub-semiconductor pattern, e.g., the first sub-semiconductor pattern 310, disposed near the first surface 301 may be smaller than an amount of the added element and an amount of zinc ion in a sub-semiconductor pattern, e.g., the third sub-semiconductor pattern 330, disposed near the second surface 302. Thus, when a content distribution of zinc ion is adjusted with a distribution of the added element, a decrease of mobility within the oxide semiconductor may be minimized. In addition, an oxidation of a metal in the source and drain electrodes 210 and 230 caused by reaction with the oxide semiconductor may be restrained.

Figure 10:
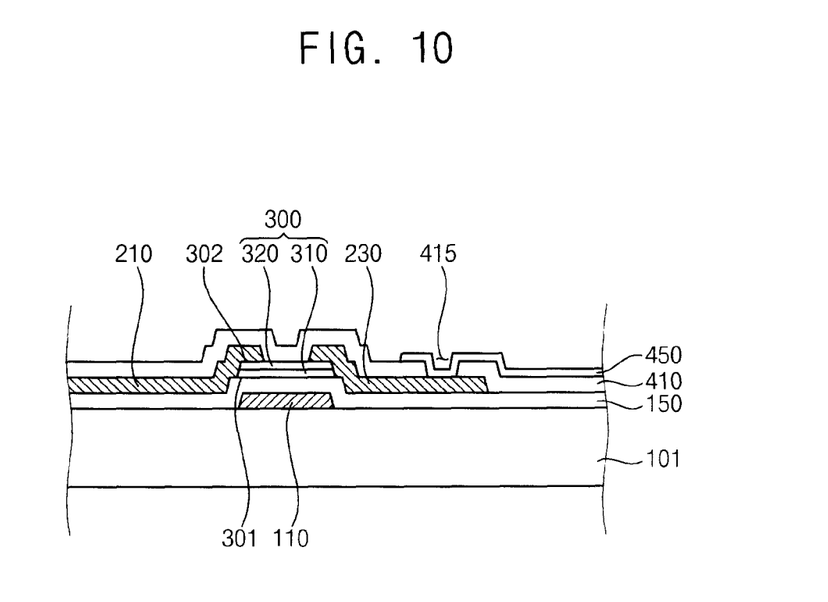
FIG. 10 is a cross-sectional view of an oxide semiconductor TFT according to another exemplary embodiment of the present invention.

FIG. 10 is a cross-sectional view of an oxide semiconductor TFT according to another exemplary embodiment of the present invention.

The TFT of FIG. 10 is substantially similar to the TFT of FIG. 8 except that the semiconductor pattern 300 is only formed on a portion of the gate electrode 110. Thus, the same reference numerals will be used to refer to the same or like parts as those described in FIG. 8, and repetitive explanations are omitted or simplified.

Referring to FIG. 10, the TFT includes a gate electrode 110, a gate insulation layer 150, a semiconductor pattern 300, a source electrode 210, and a drain electrode 230. The semiconductor pattern 300 has a double layer structure in which a first sub-semiconductor pattern 310 and a second sub-semiconductor pattern 320 are disposed. The first sub-semiconductor pattern 310 has a first surface 301 contacting the gate insulation layer 150, and the second sub-semiconductor pattern 320 has a second surface 302 contacting the source and drain electrodes 210 and 230. That is, the first sub-semiconductor pattern 310 is disposed to contact the gate insulation layer 150, and the second sub-semiconductor pattern 320 is disposed to contact the source and drain electrodes 210 and 230.

The semiconductor pattern 300 of the TFT of FIG. 8 is formed below the source and drain electrodes 210 and 230; however, the semiconductor pattern 300 of the TFT of FIG. 10 is formed only on a portion of the gate electrode 110. In a case of the TFT of FIG. 8, since the source electrode 210, the drain electrode 230 and the semiconductor pattern 300 may be patterned through the same mask, the semiconductor pattern 300 is formed below the source and drain electrodes 210 and 230. However, since the semiconductor pattern 300 of the TFT of FIG. 10 is patterned through a different mask than used for patterning the source and drain electrodes 210 and 230, the semiconductor pattern 300 is formed only where the gate electrode 110 is formed.

Although a pattern structure of the semiconductor pattern 300 of the TFT shown in FIG. 10 is different from a pattern structure of the semiconductor pattern 300 of the TFT shown in FIG. 8, principles discussed above are applicable to each of the semiconductor patterns.

That is, to prevent oxidation of a metal in the source and drain electrodes 210 and 230 contacting the semiconductor pattern 300, the second sub-semiconductor pattern 320, which contacts the source and drain electrodes 210 and 230, may include an added element having an absolute value of a second oxide formation free energy that is greater than or equal to an absolute value of the first oxide formation free energy of the metal in the source and drain electrodes 210 and 230. Restraining oxidation of the metal in the source and drain electrodes 210 and 230 by the added element and restraining an extraction of an ion in the oxide semiconductor is described above, and repetitive explanations are omitted or simplified.

In order to minimize a decrease of charge mobility, an amount of the added element in the first sub-semiconductor pattern 310 that does not contact the source and drain electrodes 210 and 230 may be zero or smaller than an amount of the added element in the second sub-semiconductor pattern 320.

Moreover, regardless of a first oxide formation free energy of a metal included in the source and drain electrodes 210 and 230, zinc ion may be added to the second sub-semiconductor pattern 320 contacting the source and drain electrodes 210 and 230 so that oxidation of the metal in the source and drain electrodes 210 and 230 may be restrained. Restraining oxidation of the metal included in the source and drain electrodes 210 and 230 by adding zinc ion to the oxide semiconductor and restraining an extraction of an ion in the oxide semiconductor is described above, and repetitive explanations are omitted or simplified.

Moreover, an amount of the added element having an absolute value of a second oxide formation free energy that is greater than or equal to an absolute value of a first oxide formation free energy of the metal element in the source and drain electrodes 210 and 230 may be adjusted together with a distribution of zinc ion. For example, an amount of the added element and an amount of zinc ion in the first sub-semiconductor pattern 310 may be zero or smaller than an amount of the added element and an amount of zinc ion in the second sub-semiconductor pattern 320. Thus, when a distribution of zinc ion is adjusted together with a distribution of the added element, a decrease of mobility within the oxide semiconductor may be minimized. In addition, oxidation of the metal included in the source and drain electrodes 210 and 230 resulting from reaction with the oxide semiconductor may be restrained.

Figure 11:
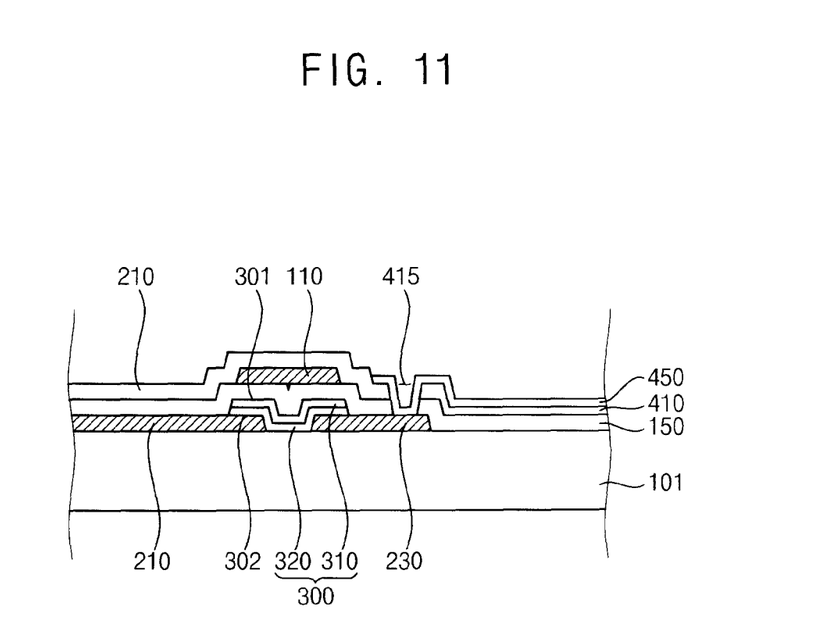
FIG. 11 is a cross-sectional view of an oxide semiconductor TFT according to another exemplary embodiment of the present invention.

FIG. 11 is a cross-sectional view of an oxide semiconductor TFT according to another exemplary embodiment of the present invention.

The TFT of FIG. 11 is substantially similar to the TFT of FIG. 8 except that the gate electrode 110 is disposed on the semiconductor pattern 300, and the source and drain electrodes 210 and 230 are disposed under the semiconductor pattern 300. The same reference numerals will be used to refer to the same or like parts as those described in FIG. 8, and redundant explanations are omitted or simplified.

Referring to FIG. 11, the TFT includes a gate electrode 110, a gate insulation layer 150, a semiconductor pattern 300, a source electrode 210, and a drain electrode 230. The semiconductor pattern 300 has a double layer structure in which a first sub-semiconductor pattern 310 and a second sub-semiconductor pattern 320 are disposed. The first semiconductor pattern 310 has a first surface 301 contacting the gate insulation layer 150, and the second sub-semiconductor pattern 320 has a second surface 302 contacting the source and drain electrodes 210 and 230. That is, the first sub-semiconductor pattern 310 is disposed to contact the gate insulation layer 150, and the second sub-semiconductor pattern 320 is disposed to contact the source and drain electrodes 210 and 230.

The TFT shown in FIG. 11 has a top gate structure in which the gate electrode 110 is disposed on the semiconductor pattern 300, and the source and drain electrodes 210 and 230 are disposed under the semiconductor pattern 300.

Although a structure of the TFT shown in FIG. 11 is different from a structure of the TFT shown in FIG. 8, principle of oxidation restraint and extraction restraint discussed above may be substantially applicable to each of the TFTs.

That is, to prevent oxidation of a metal in the source and drain electrodes 210 and 230 contacting the semiconductor pattern 300, the second sub-semiconductor pattern 320, which contacts the source electrode 210 and 230, may include an added element having an absolute value of a second oxide formation free energy that is greater than or equal to an absolute value of the first oxide formation free energy of the metal in the source and drain electrodes 210 and 230. Restraining oxidation of the metal included in the source and drain electrodes 210 and 230 by the added element and restraining an extraction of an ion in the oxide semiconductor is described above, and repetitive explanations are omitted or simplified.

To minimize the decrease in charge mobility of the semiconductor pattern 300, an amount of the added element in the first sub-semiconductor pattern 310 that does not contact the source and drain electrodes 210 and 230 may be zero or smaller than an amount of the added element in the second sub-semiconductor pattern 320.

Moreover, regardless of a first oxide formation free energy of a metal in the source and drain electrodes 210 and 230, zinc ion may be added to the second sub-semiconductor pattern 320 contacting the source and drain electrodes 210 and 230 so that oxidation of the metal in the source and drain electrodes 210 and 230 may be restrained. Restraining oxidation of the metal in the source and drain electrodes 210 and 230 by adding zinc ion to the oxide semiconductor and restraining an extraction of an ion in the oxide semiconductor is described above, and repetitive explanations are omitted or simplified.

Moreover, an amount of the added element having an absolute value of a second oxide formation free energy that is greater than or equal to an absolute value of a first oxide formation free energy of the metal element in the source and drain electrodes 210 and 230 may be adjusted together with a distribution of zinc ion. For example, an amount of the added element and an amount of zinc ion in the first sub-semiconductor pattern 310 may be zero or smaller than an amount of the added element and an amount of zinc ion in the second sub-semiconductor pattern 320. Thus, when a distribution of zinc ion is adjusted with a distribution of the added element, a decrease of mobility within the oxide semiconductor may be minimized. In addition, oxidation of the metal included in the source and drain electrodes 210 and 230 resulting from reaction with the oxide semiconductor may be restrained.

Thus, in TFT's according to various exemplary embodiments of the present invention, a decrease of mobility within the oxide semiconductor may be minimized, and oxidation of a metal included in the source and drain electrodes resulting from reaction with the oxide semiconductor may be restrained. Moreover, an effect of restraining a deoxidation of an ion included in the oxide semiconductor may be achieved.

The TFT disposed on a pixel area of an array substrate is shown in FIG. 1; however, a usage of the TFT according to the present invention is not limited to that exemplary embodiment. For example, the TFT may be adopted as a TFT used to a scan driving circuit disposed at a peripheral of a pixel area or a shift register disposed at the peripheral of the pixel area in addition to other uses.

The foregoing is illustrative of the present invention and is not to be construed as limiting thereof. Although a few example embodiments of the present invention have been described, those skilled in the art will readily appreciate that many modifications are possible in the exemplary embodiments without departing from the novel teachings and advantages of the present invention.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An oxide semiconductor thin-film transistor (TFT), comprising:
   a gate electrode disposed on a substrate;
   a source electrode and a drain electrode both comprising a first metal element with a first oxide formation free energy;
   a gate insulation layer insulating the gate electrode from the source electrode and the drain electrode; and
   an oxide semiconductor pattern comprising:
   a first surface contacting the gate insulation layer; and
   a second surface contacting the source electrode and the drain electrode, the second surface opposing the first surface,
   wherein the oxide semiconductor pattern entirely comprises an oxide material comprising an ion of at least one of indium (In), gallium (Ga), zinc (Zn), and tin (Sn), and further comprises an added element other than indium (In), gallium (Ga), zinc (Zn), and tin (Sn), with a second oxide formation free energy, the absolute value of the second oxide formation free energy being greater than or equal to the absolute value of the first oxide formation free energy, and
   wherein, in the oxide semiconductor pattern, an amount of the added element in a portion proximate to the first surface is zero or smaller than an amount of the added element in a portion proximate to the second surface.

2. The oxide semiconductor TFT of claim 1, wherein the first metal element comprises titanium (Ti), and the added element comprises at least one of titanium (Ti), yttrium (Y), scandium (Sc), tantalum (Ta), zirconium (Zr), and hafnium (Hf).

3. The oxide semiconductor TFT of claim 1, wherein the first metal element comprises aluminum (Al), and
   the added element comprises at least one of aluminum (Al), lanthanum (La), silicon (Si), cerium (Ce), praseodymium (Pr), neodymium (Nd), niobium (Nb), titanium (Ti), yttrium (Y), scandium (Sc), tantalum (Ta), zirconium (Zr), and hafnium (Hf).

4. The oxide semiconductor TFT of claim 1, wherein the first metal element comprises molybdenum (Mo), and
   the added element comprises at least one of molybdenum (Mo), vanadium (V), tungsten (W), aluminum (Al), lanthanum (La), silicon (Si), cerium (Ce), praseodymium (Pr), neodymium (Nd), niobium (Nb), titanium (Ti), yttrium (Y), scandium (Sc), tantalum (Ta), zirconium (Zr), and hafnium (Hf).

5. The oxide semiconductor TFT of claim 1, wherein the oxide semiconductor pattern comprises a first sub-semiconductor pattern contacting the gate insulation layer and a second sub-semiconductor pattern contacting the source electrode and the drain electrode, and
   an amount of the added element in the first sub-semiconductor pattern is zero or smaller than an amount of the added element in the second sub-semiconductor pattern.

6. The oxide semiconductor TFT of claim 5, wherein the first sub-semiconductor pattern and the second sub-semiconductor pattern both comprise an oxide material comprising an ion of at least one of indium (In), gallium (Ga), zinc (Zn), and tin (Sn),
   the second sub-semiconductor pattern comprises Zn ion, and
   an amount of Zn ion in the first sub-semiconductor pattern is zero or smaller than an amount of Zn ion in the second sub-semiconductor pattern.

7. The oxide semiconductor TFT of claim 1, wherein the oxide semiconductor pattern comprises at least three sub-semiconductor patterns, and
   an amount of the added element in the sub-semiconductor pattern proximally disposed to the first surface is smaller than an amount of the added element in the sub-semiconductor pattern proximally disposed to the second surface.

8. The oxide semiconductor TFT of claim 7, wherein the amount of the added element in the sub-semiconductor pattern proximally disposed to the first surface is substantially zero.

9. The oxide semiconductor TFT of claim 7, wherein the at least three sub-semiconductor patterns each comprise an oxide material comprising an ion of at least one of indium (In), gallium (Ga), zinc (Zn) and tin (Sn), and
   an amount of Zn ion in the sub-semiconductor pattern proximally disposed to the first surface is smaller than an amount of Zn ion in the sub-semiconductor pattern proximally disposed to the second surface.

10. The oxide semiconductor TFT of claim 9, wherein the amount of Zn ion in the sub-semiconductor pattern proximally disposed to the first surface is substantially zero.

11. The oxide semiconductor TFT of claim 1, wherein an amount of the added element gradually decreases from the second surface to the first surface, the largest amount being in a portion of the oxide semiconductor pattern proximal to the second surface.

12. The oxide semiconductor TFT of claim 1, wherein
the amount of Zn ion in the oxide semiconductor pattern gradually decreases from the second surface to the first surface, the largest amount being in a portion of the oxide semiconductor pattern proximal to the second surface.

13. An oxide semiconductor thin-film transistor (TFT), comprising:
a gate electrode disposed on a substrate;
a source electrode and a drain electrode both comprising a first metal element;
a gate insulation layer insulating the gate electrode from the source electrode and the drain electrode; and
an oxide semiconductor pattern comprising:
an oxide material comprising an ion of at least one of indium (In), gallium (Ga), zinc (Zn), and tin (Sn);
a first surface contacting the gate insulation layer; and
a second surface contacting the source electrode and the drain electrode, the second surface disposed opposite the first surface,
wherein, in the oxide semiconductor pattern, a portion proximal to the second surface further comprises Zn ion, and an amount of Zn ion in a portion proximal to the first surface is zero or smaller than the amount of Zn ion in the portion proximal to the second surface,
wherein the first metal element has a first oxide formation free energy, and
wherein the oxide semiconductor pattern further comprises an added element with a second oxide formation free energy, the absolute value of the second oxide formation free energy is greater than or equal to the absolute value of the first oxide formation free energy.

14. The oxide semiconductor TFT of claim 13, wherein the oxide semiconductor pattern further comprises a first sub-semiconductor pattern contacting the gate insulation layer and a second sub-semiconductor pattern contacting the source electrode and the drain electrode,
the second sub-semiconductor pattern comprises Zn ion, and
an amount of Zn ion in the first sub-semiconductor pattern is zero or smaller than an amount of Zn ion in the second sub-semiconductor pattern.

15. The oxide semiconductor TFT of claim 13, wherein the oxide semiconductor pattern further comprises at least three sub-semiconductor patterns, and
an amount of Zn ion in the sub-semiconductor pattern proximally disposed to the first surface is smaller than an amount of Zn ion in the sub-semiconductor pattern proximally disposed to the second surface.

16. The oxide semiconductor TFT of claim 15, wherein the amount of Zn ion in the sub-semiconductor pattern proximally disposed to the first surface is substantially zero.

17. The oxide semiconductor TFT of claim 13, wherein the amount of Zn ion in the oxide semiconductor pattern gradually decreases from the second surface to the first surface, the largest amount being in a portion of the oxide semiconductor pattern proximal to the second surface.

18. The oxide semiconductor TFT of claim 13, wherein an amount of the added element in a portion proximal to the first surface is zero or smaller than an amount of the added element in a portion proximal to the second surface.

19. The oxide semiconductor TFT of claim 13, wherein the first metal element comprises at least one of titanium (Ti), aluminum (Al), tantalum (Ta), silicon (Si), neodymium (Nd), niobium (Nb), yttrium (Y) and scandium (Sc).

\* \* \* \* \*